(12) United States Patent
Barakat et al.

(10) Patent No.: US 9,401,721 B1
(45) Date of Patent: Jul. 26, 2016

(54) REFERENCE VOLTAGE GENERATION AND TUNING

(71) Applicant: Advanced Micro Devices, Inc., Sunnyvale, CA (US)

(72) Inventors: Shadi Barakat, Sunnyvale, CA (US); Bhuvanachandran K. Nair, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/740,427

(22) Filed: Jun. 16, 2015

(51) Int. Cl.
 *H03L 7/06* (2006.01)
 *H03L 7/08* (2006.01)
(52) U.S. Cl.
 CPC ................... *H03L 7/0807* (2013.01)
(58) Field of Classification Search
 USPC .................. 327/147–149, 156–158
 See application file for complete search history.

(56) References Cited

U.S. PATENT DOCUMENTS

| | | | |
|---|---|---|---|
| 7,042,252 | B2 | 5/2006 | Galloway et al. |
| 7,439,816 | B1* | 10/2008 | Lombaard ............ H03L 7/07 331/11 |
| 7,991,098 | B2 | 8/2011 | Hollis |
| 8,850,155 | B2 | 9/2014 | Brandl et al. |
| 2008/0238489 | A1* | 10/2008 | Sanduleanu ......... H03L 7/087 327/42 |
| 2011/0158298 | A1* | 6/2011 | Djadi ............... H04B 1/38 375/219 |
| 2011/0227615 | A1* | 9/2011 | Faison .............. H03L 7/099 327/157 |
| 2012/0086482 | A1* | 4/2012 | Maheshwari ....... H03L 7/0998 327/156 |
| 2012/0093273 | A1* | 4/2012 | Chen ............... H04L 7/0338 375/355 |
| 2014/0192929 | A1* | 7/2014 | Mehta .............. H04L 7/0338 375/316 |
| 2014/0195867 | A1* | 7/2014 | Gollub ............ G11C 29/00 714/719 |
| 2014/0195995 | A1* | 7/2014 | Bickford ......... G06F 17/5009 716/113 |
| 2014/0312942 | A1* | 10/2014 | Heo ................. H03L 7/08 327/154 |
| 2015/0109060 | A1* | 4/2015 | Huang .............. H03L 1/00 331/16 |
| 2016/0065394 | A1* | 3/2016 | Sindalovsky ..... H04L 7/0033 375/371 |

OTHER PUBLICATIONS

JEDEC Solid State Technology Association, "DDR4 SDRAM, JESD79-4," Data Sheet, Sep. 2012, 8 pages.

* cited by examiner

*Primary Examiner* — Adam Houston
(74) *Attorney, Agent, or Firm* — Polansky & Associates, P.L.L.C.; Paul J. Polansky

(57) ABSTRACT

A data recovery circuit includes a comparator for providing a comparator output signal in response to a difference in voltage between a data input signal and the reference voltage, a sampling circuit for sampling the comparator output signal to provide a sample signal, a summing circuit for providing an up signal in response to an average of logic high values of the sample signal exceeding logic low values of the input samples signal, and a down signal in response to an average of the low logic values of the sample signal exceeding the logic high values of the sample signal, a counter for counting up in response to activations of the up signal and counting down in response to activations of the down signal to provide a count signal, and a reference voltage generator for generating the reference voltage in response to the count signal.

23 Claims, 8 Drawing Sheets

REFERENCE VOLTAGE GENERATION AND TUNING

FIELD

This disclosure relates generally to data communication systems, and more specifically to generating and tuning a reference voltage that may be used in clock and data recovery (CDR) circuits of digital data communication systems.

BACKGROUND

Digital data communication systems use a clock signal to transmit or receive data. Systems in which the transmitting device sends the clock signal along with the data to the receiving device are known as source synchronous systems. A problem occurs in high speed source synchronous systems due to the fact that it is difficult to match the printed circuit board trace lengths between the clock and data signals, causing a variable amount of skew between the clock and data signals. To solve this problem, the receiver can use a clock and data recovery (CDR) circuit to adjust the alignment between the received local sampling clock signal and the received data so that the clock signal captures the data when it is most stable, known as the "data eye". The phase adjustment can be performed by either delaying the clock signal or the data signal until the clock signal transitions approximately in the center of the data eye.

Moreover some data transmission schemes achieve high-speed operation by using small voltage differences between data signals and a reference voltage (referred to as "$V_{ref}$"). Each bit in the incoming data stream is compared to $V_{ref}$ to determine whether the bit is in the logical "1" or logical "0" state. For example, bits whose voltage is sensed above $V_{ref}$ are interpreted as logical "1" bits and bits with a voltage value below $V_{ref}$ are interpreted as logical "0" bits. To correctly recover the data from the data stream, the receiver needs to accurately generate $V_{ref}$. Thus, proper reception of data in source synchronous systems requires not only the clock signal to transition when the data signals are in stable states, but also that $V_{ref}$ is accurate.

Different methods have been used to calibrate $V_{ref}$. One particular method of generating $V_{ref}$ is known as process, voltage and temperature (PVT) shmooing. PVT shmooing entails varying a PVT parameter while keeping all other parameters constant to determine pass or fail values for each setting of the varied parameter. PVT shmooing is repeated across several devices whose processing varies across the manufacturing process window, and choosing a fixed value that is used to set all parts in production. However the fixed value may be sub-optimal for certain parts and across multiple data bits and could increase the bit error rate (BER) of parts processed within acceptable manufacturing tolerances.

Figure 1:
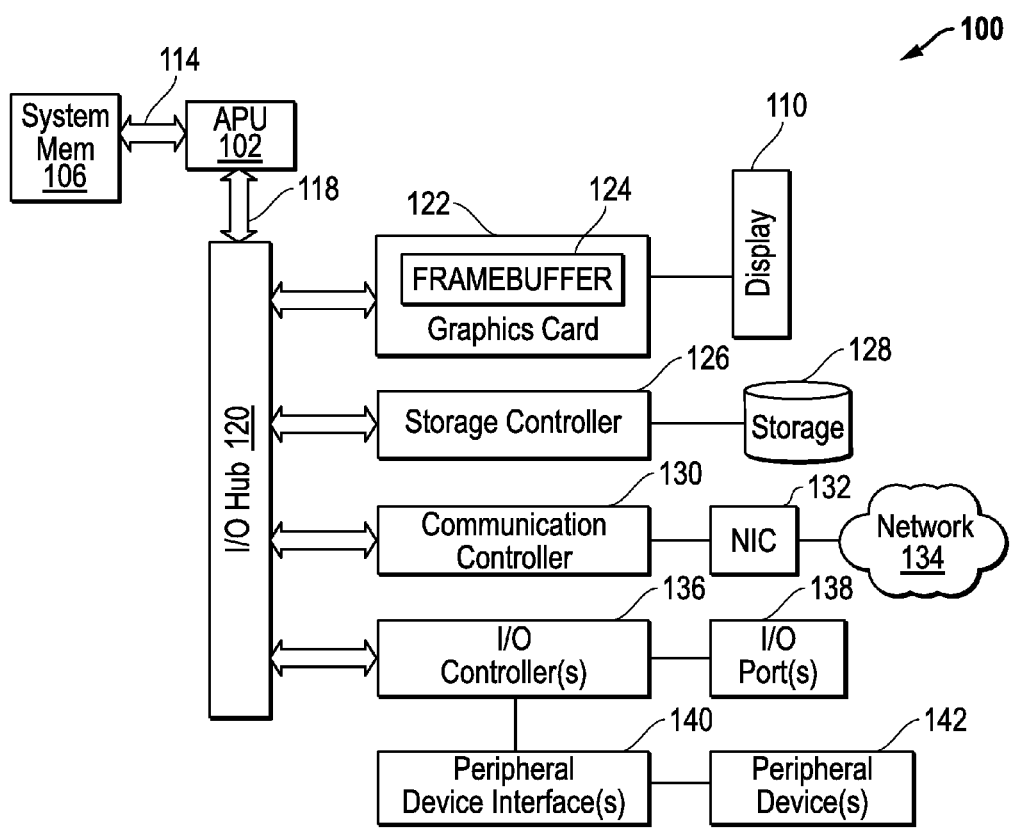
FIG. 1 illustrates a block diagram of a computing system implemented in accordance with an embodiment of the disclosure.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, a data communication system includes a data recovery circuit that tunes a reference voltage. For example, the data recovery circuit could be a receiver of a memory controller, such as a GDDR5 memory controller. The data recovery circuit includes a comparator for providing a comparator output signal in response to a difference in voltage between a data input signal and the reference voltage, a sampler for sampling the comparator output signal to provide a sample signal, a summing circuit for providing an up signal in response to an average of logic high values of the sample signal exceeding logic low values of the input samples signal, and a down signal in response to an average of the low logic values of the sample signal exceeding the logic high values of the sample signal, a counter for counting up in response to activations of the up signal and down in response to activations of the down signal to provide a count signal, and a reference voltage generator for generating the reference voltage in response to the count signal.

In another form, a data communication system includes a receiver having a plurality of data recovery circuits and a shared reference voltage loop circuit. Each data recovery circuit compares a respective one of a plurality of data input signals to a reference voltage at a time determined by a corresponding bit clock signal to provide a corresponding received data output signal. The shared reference voltage loop circuit has an input for receiving a received data output signal of one of the plurality of data recovery circuits, and an output for providing a signal representative of said reference voltage to each of said plurality of data recovery circuits, wherein in a training mode, the shared reference voltage loop circuit adjusts the signal to tune said reference voltage.

In yet another form, a method of generating a reference voltage for use in a clock and data recovery (CDR) circuit may generate a reference voltage at boot up time (i.e., when a computing system is turned on or reset) and adjusted anytime thereafter. The method includes setting the reference voltage as well as a sampling clock to an arbitrary value. The reference voltage is first coarse-tuned using the sampling clock and a first set of tuning data having a data eye with a center. After coarse-tuning the reference voltage, the sampling clock is trained to move the sampling clock to the center of the data eye. Then, the reference voltage is fine-tuned using the trained sampling clock and a second set of tuning data.

Figure 2:
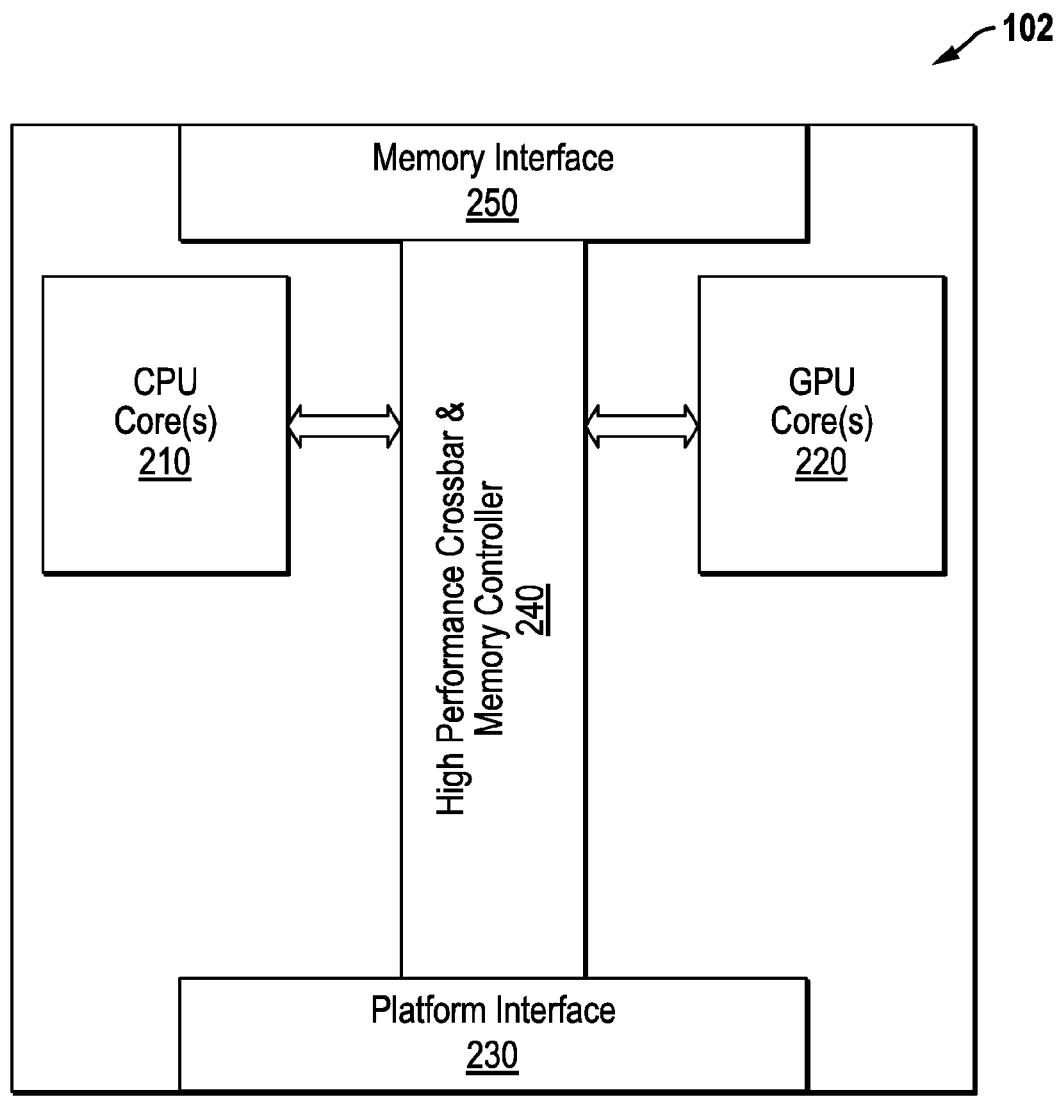
FIG. 2 illustrates a block diagram representation of an accelerated processing unit (APU) used in the computing system of FIG. 1.

FIG. 1 illustrates a block diagram of a computing system 100 implemented in accordance with an embodiment of the disclosure. Computing system 100 includes an accelerated processing unit (APU) 102. APU 102, as shown in FIG. 2, may include one or more central processing unit (CPU) cores 210 and one or more graphic processing unit (GPU) cores 220. Both CPU cores 210 and GPU cores 220 are connected to a high performance crossbar and memory controller 240. The high performance crossbar and memory controller 240 is connected to an off-chip system memory (not shown) via a memory interface 250. The high performance crossbar and memory controller 240 is also connected to a platform interface 230. Platform interface 230 provides an interface through which other devices in a computer system may be attached to the APU 102.

Returning to FIG. 1, APU 102 is connected over link 114 to system memory 106 via memory interface 250 of FIG. 2. System memory 106 may include one or more dynamic random access memory (DRAM) devices or any other type of memory device that may be used as a system memory or a combination thereof.

APU 102 is also connected to an input/output (I/O) hub 120 over link 118 through platform interfaces 230 of FIG. 2. I/O hub 120 provides a platform through which various peripheral or I/O devices may be connected to computing system 100. For example, display device 110 is connected to the computing system 100 via a graphics card 122 attached to I/O hub 120. As shown in FIG. 1, graphics card 122 includes an integrated frame buffer 124 that stores complete bit-mapped images that are to be sent to display device 110.

Storage device 128, which may include hard disk drives, NVRAMs, flash drives etc., may also be connected to the computing system 100 via storage controller 126 attached to I/O hub 120. Storage device 128 may contain user data, an operating system (OS), a hypervisor in cases where the computing system 100 is logically partitioned, as well as software applications that may be needed by computing system 100 to perform any particular task. In operation, the OS, hypervisor, firmware applications and the software application needed by computing system 100 to perform a task may all be loaded into system memory 106.

Computing system 100 may include a network interface card (NIC) 132. NIC 132 is attached to I/O hub 120 through communication controller 130. Computing system 100 may use NIC 132 to interact with other computing systems over network 134. Network 134 may include connections, such as wire, wireless communication links, fiber optic cables, etc. Further, network 134 may include the Internet or may be implemented as a number of different types of networks, such as for example, an intranet, a local area network (LAN), a wide area network (WAN), a cellular phone network etc.

Computing system 100 may also include one or more I/O controllers 136 attached to I/O hub 120. The one or more I/O controllers 136 may support connection by and processing of signals from one or more connected input device(s), such as a keyboard, mouse, touch screen, camera, microphone etc. (all not shown). The one or more I/O controllers 136 may also support connection to and forwarding of output signals from one or more connected output devices. The one or more connected output devices may include audio speaker(s), printer(s) etc. (all not shown). The one or more input and output devices may be connected to the computing system 100 through one or more I/O ports 138.

Additionally, in one or more embodiments, one or more peripheral device interfaces 140 may be attached to the computing system 100 via the one or more I/O controllers 136. The one or more peripheral device interfaces 140 may support an optical reader, a universal serial bus (USB), a card reader, Personal Computer Memory Card International Association (PCMCIA) slot, and/or a high-definition multimedia interface (HDMI). The one or more peripheral device interfaces 140 may be utilized to enable data to be read from or stored to one or more peripheral devices 142. The one or more peripheral devices 142 may include removable storage devices, such as compact disks (CDs), digital video disks (DVDs), flash drives, or flash memory cards. The one or more peripheral device interfaces 140 may further include General Purpose I/O interfaces such as I2C, SMBus, and peripheral component interconnect (PCI) buses.

Figure 3:
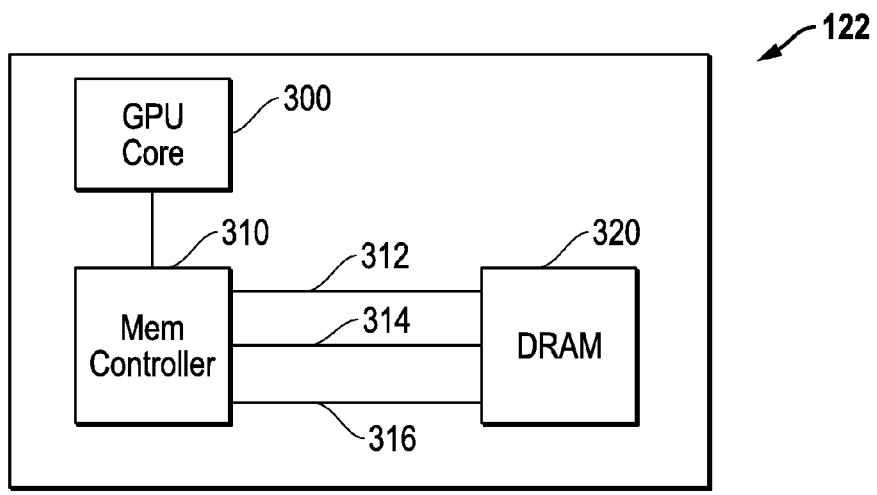
FIG. 3 illustrates a block diagram of a graphics card that may be used in the computing system of FIG. 1 according to one embodiment.

FIG. 3 illustrates a block diagram of graphics card 122 that may be used in the computing system 100 of FIG. 1 according to one embodiment. Graphics card 122 includes a GPU core 300, a memory controller 310, and a dynamic random access memory (DRAM) 320. GPU core 300 performs various tasks related to generating pixel data from graphics data supplied by CPU cores 210 and GPU cores 220 of APU 102 of FIG. 2 and/or system memory 106 of FIG. 1. For example, GPU core 300 may generate pixel data from two dimensional (2D) or three-dimensional (3D) scene data provided by various programs executing on APU 102.

DRAM 320 is connected to memory controller 310 over a high-speed bus. In one embodiment, DRAM 320 is a graphics double data rate DRAM conforming to the GDDR5 standard defined by the Joint Electron Device Engineering Council (JEDEC). DRAM 320 includes a number of memory banks (not shown). The high-speed bus includes a data strobe (DQS) portion 312, a data (DQ) portion 314, and an address and control portion 316. Memory controller 310 performs reference voltage tuning according to techniques that will be described further below.

Figure 4:
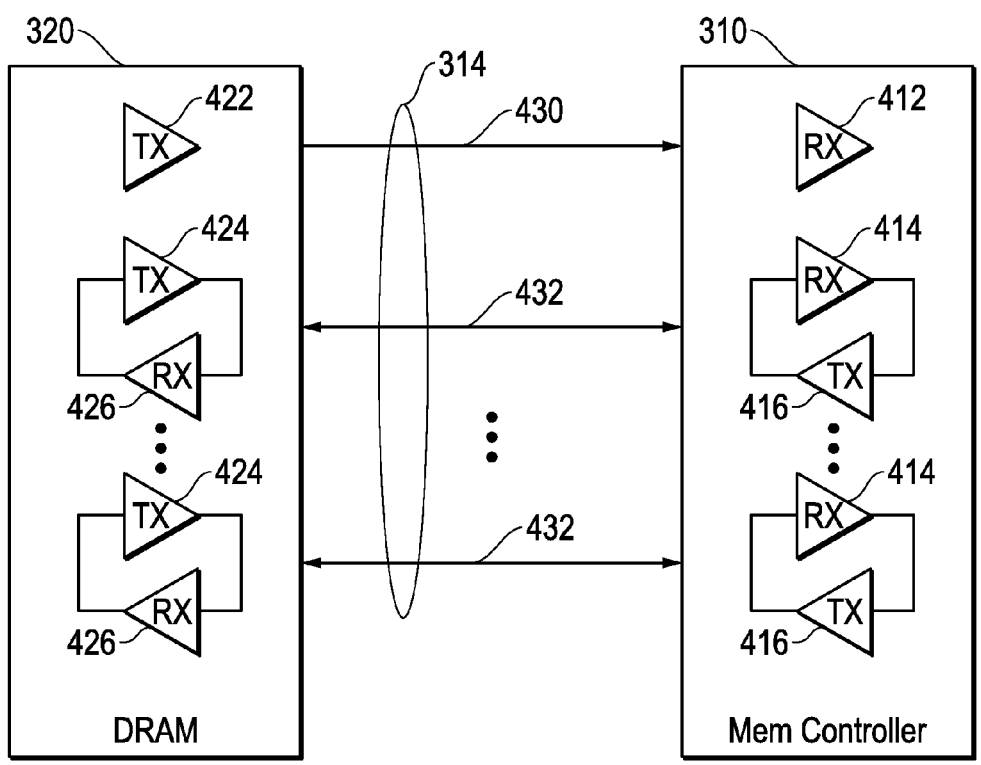
FIG. 4 illustrates in block diagram form an interconnection between a dynamic random access memory (DRAM) and a memory controller using a data signal line used in the graphics card of FIG. 3.

FIG. 4 illustrates in block diagram form an interconnection between memory controller 310 and DRAM 320 useful in understanding $V_{ref}$ tuning Memory controller 310 includes a set of I/O buffers each including a transmit buffer 414 and a receive buffer 416. Likewise DRAM 320 includes a corresponding set of I/O buffers each including a transmit buffer 424 and a receive buffer 426. The transmit (receive) buffers of memory controller 310 are connected to the receive (transmit) buffers of DRAM 320 over a corresponding set of bi-directional links 432. The number of buffers and links can be 16 or 32 according to the GDDR5 standard, but can also be any other suitable number.

In the example shown in FIG. 4, DRAM 320 includes a dedicated transmit buffer 422 and memory controller 210 includes a dedicated receiver 412 that are used in $V_{ref}$ tuning. However in other embodiments to be described later, memory controller 310 and DRAM 320 may also perform $V_{ref}$ tuning using existing transmit and receive buffers corresponding to a particular data signal.

Memory controller 310 issues various commands to DRAM 320 to initialize and program it. In particular, memory controller 310 can issue particular mode register set (MRS) commands to set $V_{ref}$ to be used in DRAM 320 according to the tuning procedure described below.

Figure 5:
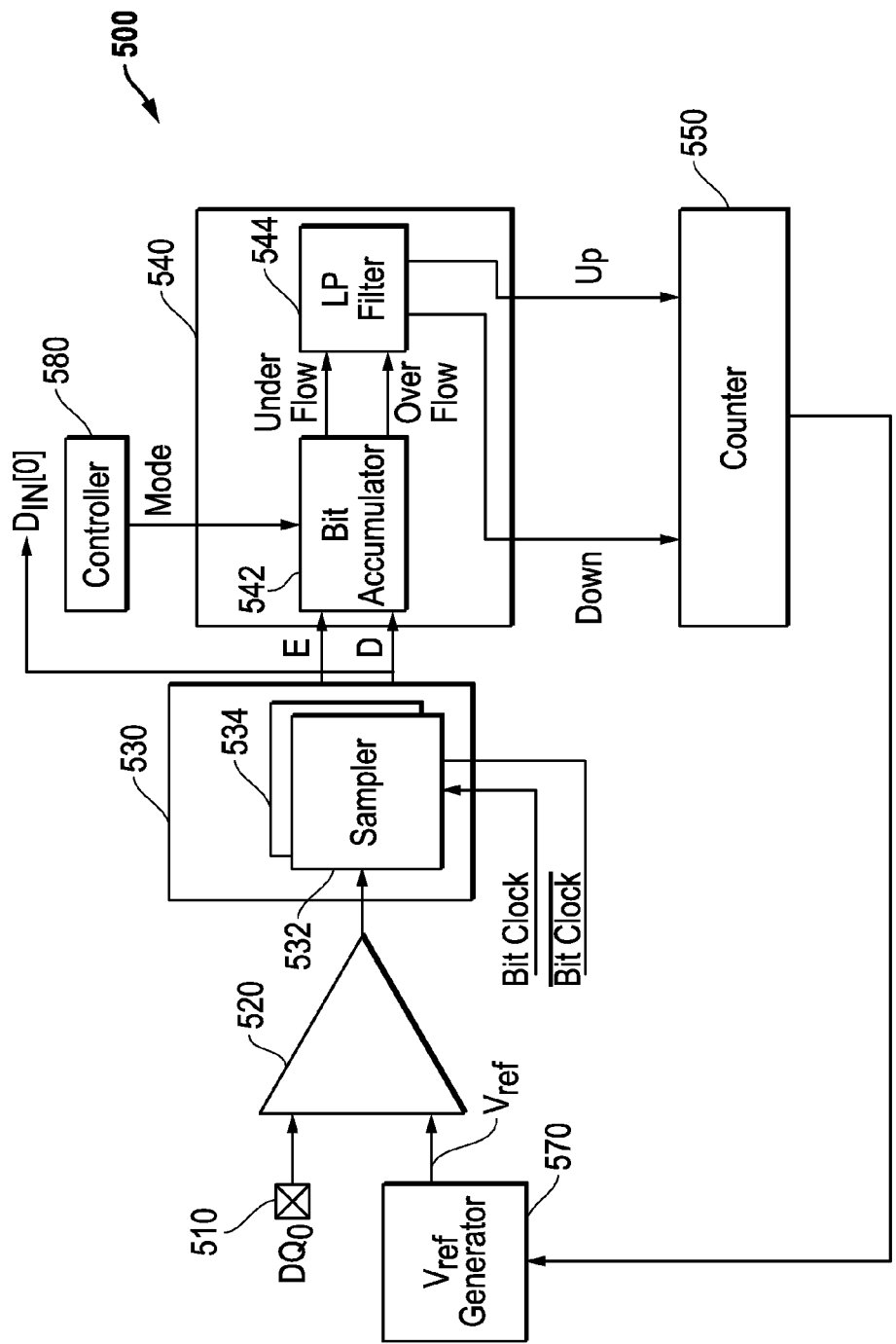
FIG. 5 illustrates in block diagram form a circuit loop used to generate and tune a voltage reference ($V_{ref}$) that may be used in a clock and data recovery (CDR) circuit used in the graphics card of FIG. 3.

FIG. 5 illustrates in block diagram form a data recovery circuit 500 that generates and tunes $V_{ref}$ according to some embodiments. Data recovery circuit 500 may be used in memory controller 310 of FIG. 3. It may be a dedicated circuit as shown in FIG. 4, or used in conjunction with an existing receive buffer as shown here in FIG. 5.

Data recovery circuit 500 includes generally a bonding pad 510, a comparator 520, a sampling circuit 530, a lowpass filter circuit 540, a counter 550, a $V_{ref}$ generator 570, and a controller 580. Bonding pad 510 conducts a bidirectional data signal labeled "$DQ_0$". Comparator 520 has a positive input connected to bonding pad 510, a negative input for receiving $V_{ref}$, and an output.

Sampling circuit 530 includes a sampler 532 and a sampler 534. Sampler 532 has a data input connected to the output of comparator 520, a clock input for receiving a signal labeled "Bit Clock", and an output for providing a signal labeled "D" that is also used as a received data signal labeled "$D_{IN}[0]$". Sampler 534 has a data input connected to the output of comparator 520, a clock input for receiving a signal labeled "$\overline{BitClock}$", and an output for providing a signal labeled "E".

Lowpass filter circuit 540 includes a bit accumulator 542 and a lowpass filter 544. Bit accumulator 542 has inputs for receiving the E and D signals, a control input for receiving a signal labeled "Mode", an output for providing a signal labeled "Under Flow", and an output for providing a signal labeled "Over Flow". Lowpass filter 540 has inputs for receiving the Under Flow and Over Flow signals, an output for providing a signal labeled "Up", and an output for providing a signal labeled "Down".

Counter 550 has a first input for receiving the Up signal, a second input for receiving the Down signal, and an output. $V_{ref}$ generator 570 has an input connected to the output of counter 550, and an output connected to the negative input of comparator 520.

In operation, data recovery circuit 500 is a closed-loop system that generates $V_{ref}$ based on evaluating the average value of the received data signal evaluated by comparator 520. Sampling circuit 530 includes sampler 532 to capture the output of comparator 520 on a rising edge of the Bit Clock signal to provide the D and $D_{IN}[0]$ signals, and sampler 534 to capture the output of comparator 520 on a rising edge of the $\overline{BitClock}$ signal to provide the E signal. Lowpass filter circuit 540 operates as a summing circuit that accumulates the D and E signals in bit accumulator 542 and then averages them over time in lowpass filter 544. If on average comparator 520 outputs more 1s than 0s, then lowpass filter 544 provides the Up signal to cause counter 550 to increase a digital code. If on average comparator 520 outputs more 0s than 1s, then lowpass filter 544 provides the Down signal to cause counter 550 to decrease the digital code. $V_{ref}$ generator 570 is a digital-to-analog converter that converts the digital cover to an analog voltage for $V_{ref}$. In this way using closed loop operation, data recovery circuit 500 sets $V_{ref}$ to a value that samples as many 1s as 0s and thus is close to optimal.

Controller 580 is used to provide the Mode signal to set bit accumulator 542 into an appropriate mode. For example as will be explained below, controller 580 can set bit accumulator 542 into either a level accumulator mode or an edge accumulator mode. In the level accumulator mode, the received pattern should have equal numbers of '0's and '1's and a continuously alternating pattern of 1s and 0s, such as "101010 . . . ". Bit accumulator 542 treats both the D and E samples as sampled data and hence the exact position of the bit clock is not critical for the loop to work. For example if one of the samplers is sampling the data at the worst point in which the data is in meta-stability, the other sampler will sample stable data. The Level accumulator mode can be used for both coarse and fine tuning steps as long as these requirements for the tuning pattern are met. Data recovery circuit 500 may also generate an extra control signal to freeze bit accumulator 542 when no '0's are detected by either sampler 532 or sampler 534 and a pullup resistor is connected to bonding pad 510. In this case, the initial value of the $V_{ref}$ should be set to the maximum possible value.

In the edge accumulator mode, bit accumulator 542 will be active only if there are transitions in $DQ_0$. Bit accumulator 542 looks at the E samples that occur between transitions. So it might not be suitable for the coarse tuning step, when the initial Vref is out of range. The edge accumulator mode can be used with a realistic pattern on $DQ_0$ because it does not rely on the average level of the input data.

Figure 6:
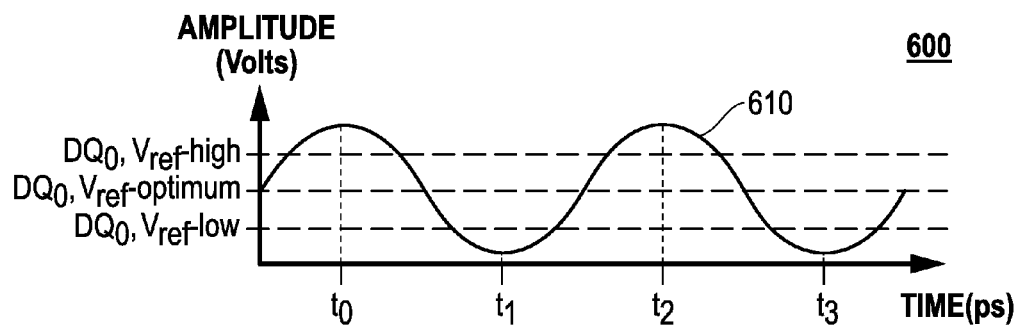
FIG. 6 illustrates a timing diagram useful in understanding the operation of data recovery circuit 500 of FIG. 5.

The operation of data recovery circuit 500 will now be explained with reference to a particular example. FIG. 6 illustrates a timing diagram 600 useful in understanding the operation of data recovery circuit 500 of FIG. 5. In timing diagram 600, the horizontal axis represents time in picoseconds (ps), and the vertical axis represents amplitude in volts. Along the horizontal axis are four time points of interest labeled "$t_0$", "$t_1$", "$t_2$", and "$t_3$", and along vertical axis are three voltages of interest labeled "$V_{ref}$-high", "$V_{ref}$-low", and "$V_{ref}$-optimum". Shown in timing diagram 600 is a waveform 610 corresponding to data signal $DQ_0$ as it transitions continuously between logic 1 and logic 0 states. Waveform 610 is received as a signal that transitions in a nearly sinusoidal shape due to the effects of the highly loaded transmission line between DRAM 320 and memory controller 310. Comparator 520 interprets the logic state of data signal $DQ_0$ to be in the high or "1" logic state when waveform 610 is at a higher voltage than the reference level, and in the low or "0" logic state when waveform 610 is at a lower voltage than the reference level. Waveform 610 has an inherent optimum reference level at $V_{ref}$-optimum which corresponds to the $V_{ref}$ level about which waveform 610 is centered.

Figure 7:
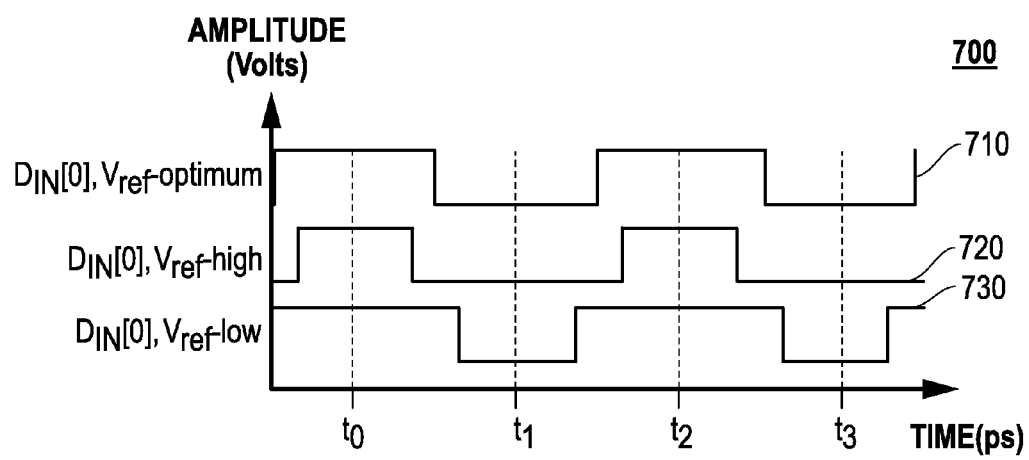
FIG. 7 illustrates a timing diagram showing the logic states recognized by the data recovery circuit of FIG. 5 using the reference levels of FIG. 6.

FIG. 7 illustrates a timing diagram 700 showing the logic states recovered by data recovery circuit 500 of FIG. 5 using the reference levels of FIG. 6. In timing diagram 700, the horizontal axis represents time in ps, and the vertical axis represents amplitude in volts. Along the horizontal axis are four time points of interest $t_0$, $t_1$, $t_2$, and $t_3$ corresponding to similarly labeled time points in FIG. 6. Timing diagram 700 illustrates three waveforms of interest, including a waveform 710 corresponding to $D_{IN}[0]$ when $V_{ref}$ is set to $V_{ref}$-optimum, a waveform 720 corresponding to $D_{IN}[0]$ when $V_{ref}$ is set to $V_{ref}$-high, and a waveform 730 corresponding to $D_{IN}[0]$ when $V_{ref}$ is set to $V_{ref}$-low. As can be readily seen, all three waveforms evaluate $D_{IN}[0]$ in its correct logic state at time points $t_0$, $t_1$, $t_2$, and $t_3$. However when $V_{ref}$ is set to $V_{ref}$-low, comparator 520 evaluates $D_{IN}[0]$ as being in the logic high state longer than in the logic low state, and when $V_{ref}$ is set to $V_{ref}$-high, comparator 520 evaluates $D_{IN}[0]$ as being in the logic low longer that in the logic high state. Only when $V_{ref}$ is set to $V_{ref}$-optimum does comparator 520 evaluate $D_{IN}[0]$ as being in the logic low and logic high states for about the same amount of time.

The result of this distortion is that it becomes difficult for data recovery circuits to sample all data signals in their correct logic states, and in the presence of noise, BER increases. However the inventors have leveraged this characteristic to form data recovery circuit 500 to automatically control $V_{ref}$ to place a tuned $V_{ref}$ value it at its optimum or near-optimum point and thereby reduce BER.

Figure 8:
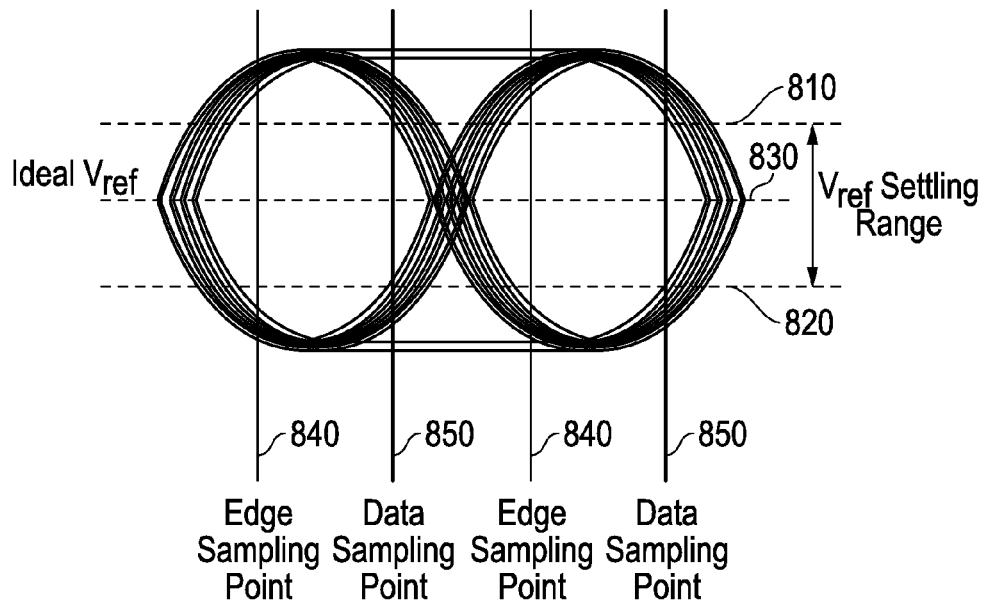
FIG. 8 illustrates a timing diagram showing a data eye using the data recovery circuit of FIG. 5 during coarse training mode.

FIG. 8 illustrates a timing diagram 800 showing a data eye using the data recovery circuit of FIG. 5 during coarse training mode. The eye diagram is an oscilloscope display generated by overlaying sweeps of different segments of tuning data driven by a master clock. In timing diagram 800, the horizontal axis represents time in ps, and the vertical axis represents amplitude in volts. Along the horizontal axis are four time points of interest including an edge sampling point 840, a data sampling point 850, another edge sampling point 840, and another data sampling point 850. Along the vertical axis are three references values 810, 820, and 830 corresponding to low, high, and ideal values for $V_{ref}$. During coarse tuning, controller 580 provides the Mode signal to select the Level Accumulator mode. Data recovery circuit 500 receives a continuously alternating pattern of zeros and ones, namely "101010 . . . ". Thus at any time a moving average of the number of ones and zeros will be about the same. During coarse tuning, the sampling clock signal need not be set to any particular phase. Data recovery circuit 500 will settle on a value of $V_{ref}$ that will detect 0s and 1s, although not necessarily at the optimum value. The offset from the optimum value will depend on how far the clock is from the center of the data eye. After the $V_{ref}$ tuning loop has settled, memory controller 310 can then perform timing recovery and eventually enter a fine tuning mode for $V_{ref}$.

Figure 9:
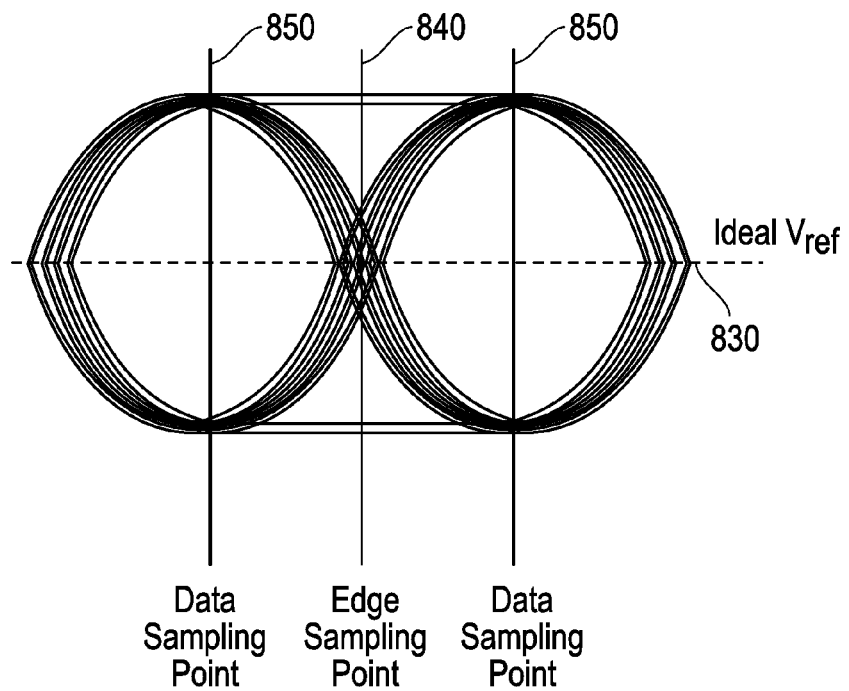
FIG. 9 illustrates a timing diagram showing a data eye using the data recovery circuit of FIG. 5 during fine training mode.

FIG. 9 illustrates a timing diagram showing a data eye using the data recovery circuit of FIG. 5 during fine tuning mode. The eye diagram is the same oscilloscope display generated by overlaying sweeps of different segments of tuning data that was shown in FIG. 8. As in FIG. 8, the horizontal axis represents time in ps, and the vertical axis represents amplitude in volts. Along the horizontal axis are three time points of interest alternately including a first data sampling point 850, an edge sampling point 840, and a second data sampling point 850. Before fine tuning, memory controller 310 sets the timing of the Bit Clock such that the data sampling point is near the center of the data eye. For example as will be explained in further detail below, memory controller 310 can run per-bit CDR with $V_{ref}$ training disabled. Since at this point $V_{ref}$ is already within a reasonable limit, the samplers will be able to detect data transitions. After the CDR loop locks, memory controller 310 enables $V_{ref}$ tuning in fine tuning mode. Any suitable random pattern can be used if bit accumulator 542 is set to edge accumulator mode, but if the accumulator is set to level accumulator mode, then the received pattern should again be the alternating pattern of zeros and ones, namely "101010 . . . ".

Figure 10:
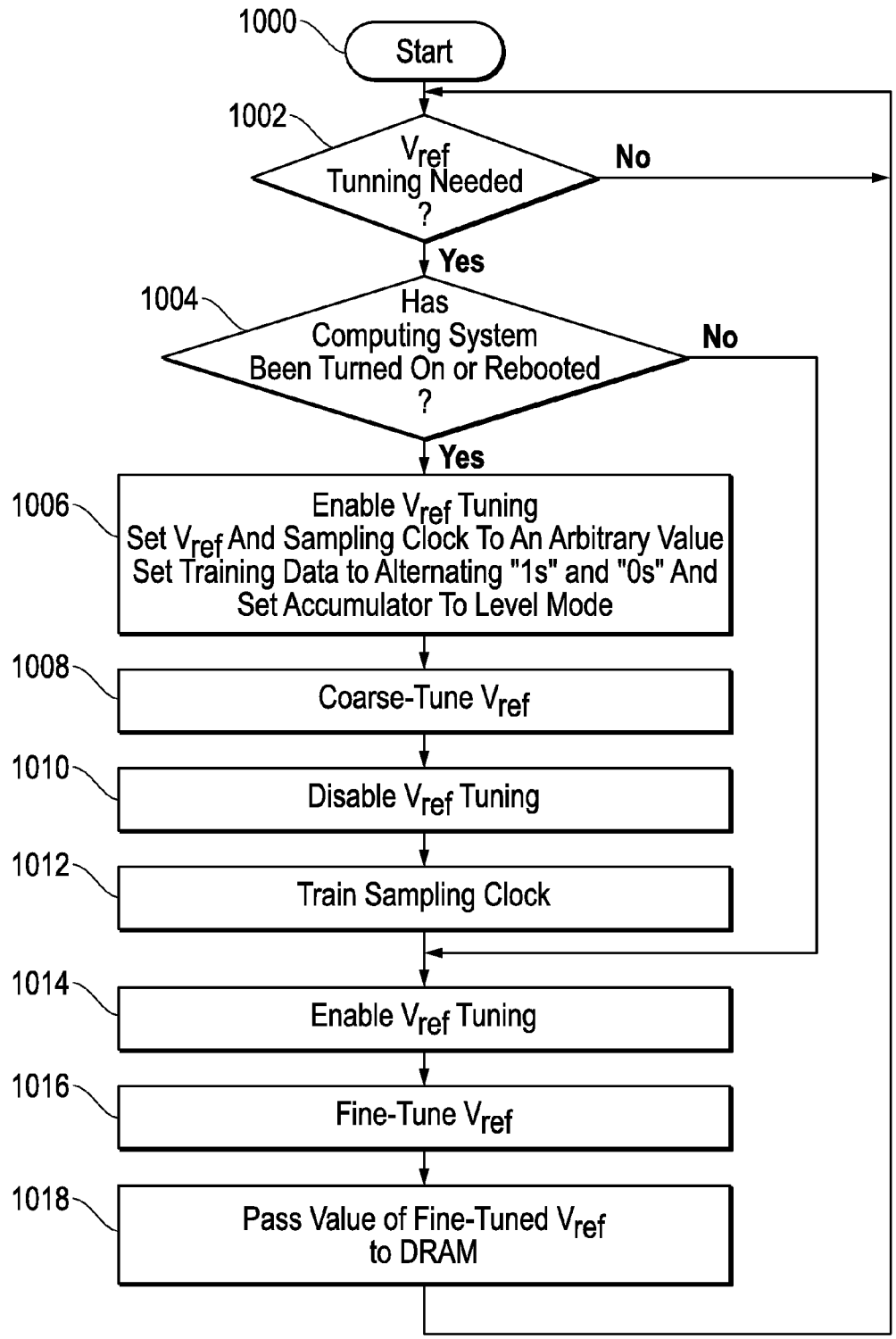
FIG. 10 illustrates a flow diagram of a process that may be used by the memory controller of FIG. 4 to generate and tune a $V_{ref}$ that may be used by a CDR circuit, according to some embodiments.

FIG. 10 illustrates a flow diagram of a process that may be used by memory controller 310 to generate and tune a $V_{ref}$ that may be used by a CDR circuit in DRAM 320 according to some embodiments. The process starts at box 1000, such as when the computing system 100 is turned on or rebooted. Memory controller next determines whether or not $V_{ref}$ tuning is needed in decision box 1002. $V_{ref}$ tuning may be needed when the computing system is first turned on or rebooted or some time thereafter (i.e. whenever memory controller 310 decides that it should occur). For example, memory controller 310 may tune $V_{ref}$ on a continuous basis, may periodically tune $V_{ref}$ based on a timer, or may tune $V_{ref}$ when BER of DRAM 320 reaches a user configurable threshold.

If $V_{ref}$ tuning is not needed, the process remains at decision box 1002. For example, $V_{ref}$ tuning may not needed when memory controller 310 is tuning $V_{ref}$ on a periodic basis and the requisite amount of time has not yet elapsed since the last $V_{ref}$ tuning, or if the BER remains below the configurable threshold.

If $V_{ref}$ is to be tuned, then at decision box 1004 memory controller 310 determines whether the computing system 100 has been turned on or rebooted. If the computing system 100 has just been turned on or rebooted, then memory controller 310 first coarse tunes $V_{ref}$. If not, the process proceeds to box 1014 to fine-tune $V_{ref}$.

In box 1006, memory controller 310 enables $V_{ref}$ tuning. It sets $V_{ref}$ and the sampling clock to arbitrary or initial values. For example, memory controller could set $V_{ref}$ and the sampling clock to appropriate seed values to speed up the tuning process. It sets bit accumulator 542 to level accumulator mode and initializes DRAM 320 to output a continuous pattern of alternating "1s" and "0s". After initialization in box 1008, memory controller 310 coarse-tunes $V_{ref}$ using data recovery circuit 500. After coarse-tuning is complete, memory controller 310 disables $V_{ref}$ tuning at box 1010, and then trains the sample clock at box 1012 using CDR techniques to set the sample clock to the center of the data eye.

Next memory controller 310 proceeds to fine-tune $V_{ref}$. Memory controller 310 enables $V_{ref}$ tuning at box 1014 and sets bit accumulator 542 to an appropriate mode. As mentioned above, memory controller 310 may set bit accumulator 542 in either level accumulator mode or edge accumulator mode. If memory controller 310 sets bit accumulator 542 to level accumulator mode, then it enables DRAM 320 to output a continuous pattern of alternating "1s" and "0s". If, on the other hand, memory controller 310 sets bit accumulator 542 to edge accumulator mode, the tuning data may include an arbitrary pattern of "1s" and "0s". Data recovery circuit 500 then fine tunes $V_{ref}$ at box 1016. Then at box 1018, the value of $V_{ref}$ is fed back to DRAM 320. The process ends when the computing system 100 is turned off or rebooted.

Figure 11:
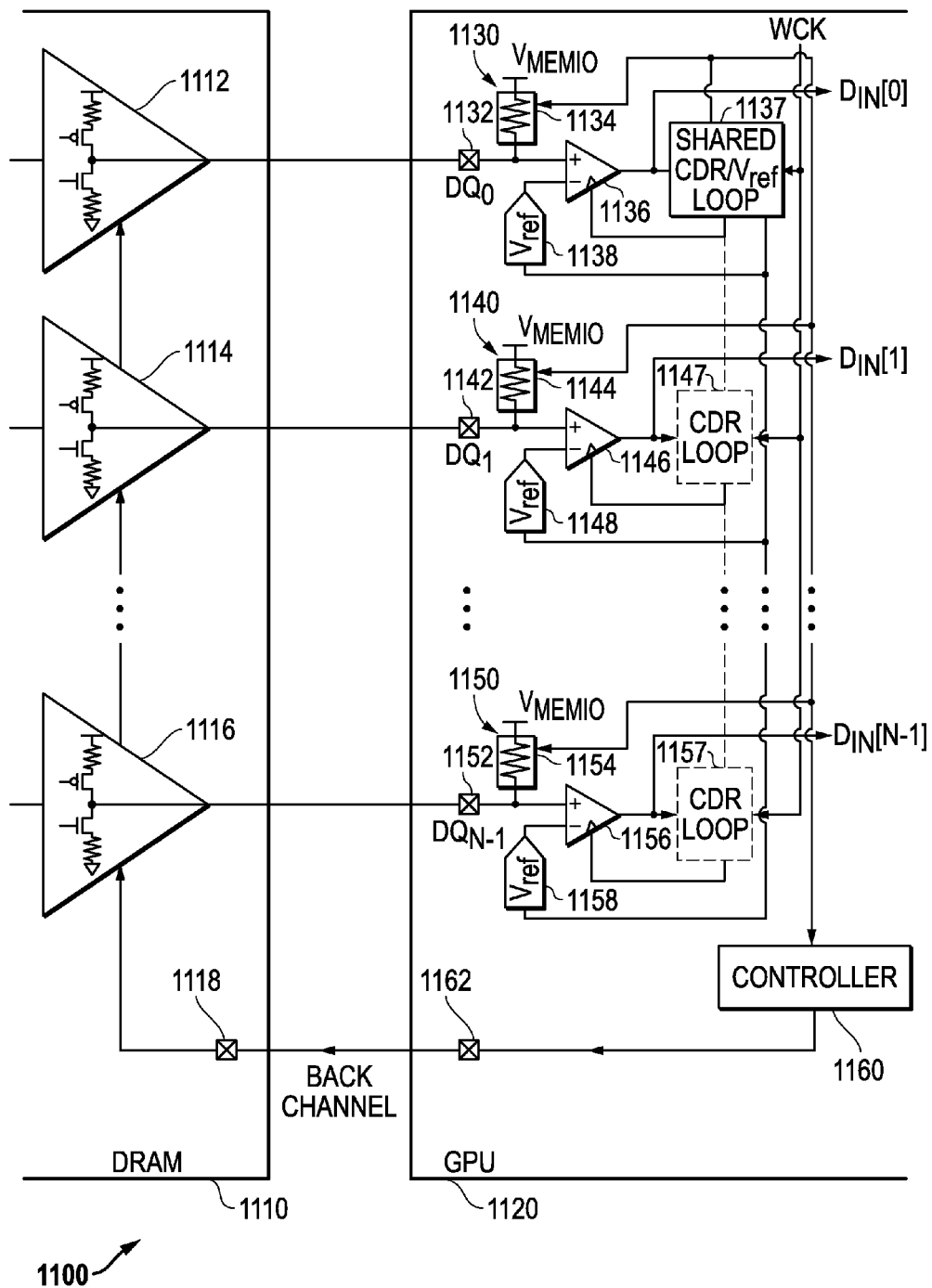
FIG. 11 illustrates in partial block diagram and partial schematic form a data communication system using reference voltage generation and tuning according to some embodiments.

FIG. 11 illustrates in partial block diagram and partial schematic form a data communication system 1100 using reference voltage generation and tuning according to some embodiments. Data communication system 1100 is similar to the data communication system of FIGS. 3 and 4, and includes generally a data transmission portion of a DRAM 1110 and a data reception portion of a GPU 1120. DRAM 1110 includes representative output buffers 1112, 1114, and 1116 and a bonding pad 1118. Each of output buffers 1112, 1114, and 1116 includes a driver that outputs a respective data signal having a characteristic impedance and that generates logic levels with respect to $V_{ref}$. Thus each output buffer is shown as having a final stage with a series combination of a first resistor, a P-channel MOS pullup transistor, an N-channel pulldown transistor, and a second resistor connected in series between a power supply voltage terminal and ground. Moreover, bonding pad 1118 is connected to each of output buffers 1112, 1114, and 1116 and provides a $V_{ref}$ feedback signal that each output buffer uses to set the midpoint of data transitions.

GPU 1120 includes a set of per-bit data recovery circuits for each bit of the data bus, including representative data recovery circuits 1130, 1140, and 1150 corresponding data bits $DQ_0$, $DQ_1$, and $DQ_{N-1}$, respectively, a controller 1160, and a bonding pad 1162. Data recovery circuit 1130 includes a bonding pad 1132, a termination resistor 1134, a comparator circuit 1136, a shared CDR/$V_{ref}$ loop circuit 1137, and a $V_{ref}$ generator 1138. Bonding pad 1132 conducts data input/output signal $DQ_0$. Termination resistor 1134 has a first terminal for receiving an input/output power supply voltage labeled "$V_{MEMIO}$", a second terminal connected to bonding pad 1132, and a control terminal. Comparator 1136 has a positive input connected to bonding pad 1132, a negative input, a clock input, and an output for providing an internal data signal labeled "$D_{IN}[0]$". Shared CDR/$V_{ref}$ loop circuit 1137 has a first input for receiving write clock signal WCLK, a second input connected to the output of comparator circuit 1136, a first output connected to the clock input of comparator circuit 1136, and a second output. $V_{ref}$ generator 1138 has an input connected to the second output of shared CDR/$V_{ref}$ loop circuit 1137, and an output connected to the negative input of comparator circuit 1136.

Data recovery circuit 1140 includes a bonding pad 1142, a termination resistor 1144, a comparator circuit 1146, an optional CDR loop circuit 1147, and a $V_{ref}$ generator 1148. Bonding pad 1142 conducts data input/output signal $DQ_1$. Termination resistor 1144 has a first terminal for receiving $V_{MEMIO}$, a second terminal connected to bonding pad 1142, and a control terminal. Comparator 1146 has a positive input connected to bonding pad 1142, a negative input, a clock input, and an output for providing an internal data signal labeled "$D_{IN}[1]$". CDR loop circuit 1147 has a first input for receiving write clock signal WCLK, a second input connected to the output of comparator circuit 1146, and an output connected to the clock input of comparator circuit 1146. $V_{ref}$ generator 1148 has an input connected to the second output of shared CDR/$V_{ref}$ loop circuit 1137, and an output connected to the negative input of comparator circuit 1146.

Data recovery circuit 1150 includes a bonding pad 1152, a termination resistor 1154, a comparator circuit 1156, an optional CDR loop circuit 1157, and a $V_{ref}$ generator 1158. Bonding pad 1152 conducts data input/output signal $DQ_{N-1}$. Termination resistor 1154 has a first terminal for receiving $V_{MEMIO}$, a second terminal connected to bonding pad 1152, and a control terminal. Comparator circuit 1156 has a positive input connected to bonding pad 1152, a negative input, a clock input, and an output for providing an internal data signal labeled "$D_{IN}[N-1]$". CDR loop circuit 1157 has a first input for receiving write clock signal WCLK, a second input connected to the output of comparator circuit 1156, and an output connected to the clock input of comparator circuit 1156. $V_{ref}$ generator 1158 has an input connected to the second output of shared CDR/$V_{ref}$ loop circuit 1137, and an output connected to the negative input of comparator circuit 1156.

Controller 1160 has a bidirectional connection connected to data recovery circuits 1130, 1140, and 1150, and an output. In particular, the bidirectional connection receives data signal $D_{IN}[0]$ and provides a tuning output to the control inputs of termination resistors 1134, 1144, and 1154. Bonding pad 1162 is connected to the output of controller 1160, and is connected over the external bus to bonding pad 1118 on DRAM 1110 providing a signal labeled "BACK CHANNEL".

Data communication system 1100 is similar to the data communication systems discussed above except for three additional features. First, GPU 1120 optionally uses either per-bit CDR or shared CDR, but uses only a single bit ($DQ_0$) for $V_{ref}$ training using shared CDR/$V_{ref}$ loop circuit 1137. Thus shared CDR/$V_{ref}$ loop circuit 1137 provides a digital code to each data recovery circuit, which in turn uses the digital code to generate a local $V_{ref}$. Shared CDR/$V_{ref}$ loop circuit 1137 can also be used to concurrently track both timing and $V_{ref}$, in which case CDR loop circuits 1147 and 1157 are not needed and the clock output of shared CDR/Vref loop circuit 1137 provides the clock input to comparators in all the data recovery circuits such as comparators 1146 and 1156.

Note that the choice of $DQ_0$ as the pin with which to perform $V_{ref}$ training for all data pins is arbitrary and any data pin that DRAM 1110 can supply the alternating pattern of ones and zeros could be used as well. GPU 1120 also updates the $V_{ref}$ code during operation using shared CDR/$V_{ref}$ loop circuit 1137.

Second, controller 1160 optionally allows the tuned $V_{ref}$ to remain constant during operation but modulate the incoming data's $V_{ref}$ through the on-die termination (ODT) impedance to keep the incoming $V_{ref}$ substantially constant during operation.

Third, GPU 1120 can optionally provide a back channel to DRAM 1110 to dynamically adjust the $V_{ref}$ setting used in DRAM 1110. It does so by sampling the $V_{ref}$ tracking loop, filters the output, and provides a periodic impedance update to transmitters in DRAM 1110 (such as output buffers 1112, 1114, and 1116) over the BACK CHANNEL to keep the $V_{ref}$ margins of the incoming data to GPU 1120 near optimum.

These additional features can also be modified in various ways. For example, each data recovery circuit could perform its own $V_{ref}$ tuning according to the methods described above. Moreover controller 1160 could collect and communicate a corresponding per-bit $V_{ref}$ setting over the BACK CHANNEL to DRAM 1110 for application to respective output buffers. Moreover the BACK CHANNEL can also take a variety of forms, including a single bit using a bit-serial protocol as shown in FIG. 11, or a multiple-bit communication port.

Some of the functions of APU 102 of FIG. 1 may be implemented with various combinations of hardware, software and/or firmware. Further, some or all of the software components may be stored in a non-transitory computer readable storage medium for execution by at least one processor. In various embodiments, the non-transitory computer readable storage medium includes a magnetic or optical disk storage device, solid-state storage devices such as FLASH memory, or other non-volatile memory device or devices. The computer readable instructions stored on the non-transitory computer readable storage medium may be in source code, assembly language code, object code, or other instruction format that is interpreted and/or executable by one or more processors.

The circuits of FIGS. 1-5 and 11 or portions thereof may be described or represented by a computer accessible data structure in the form of a database or other data structure which can be read by a program and used, directly or indirectly, to fabricate integrated circuits with the circuits of FIGS. 1-5 and 11. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 1-5 and 11. The netlist may then be placed and routed to produce a data set describing geometric shapes to be applied to masks. The masks may then be used in various semiconductor fabrication steps to produce integrated circuits of FIGS. 1-5 and 11. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A data recovery circuit comprising:
   a comparator for providing a comparator output signal in response to a difference in voltage between a data input signal and a reference voltage;
   a sampling circuit for sampling said comparator output signal to provide a sample signal;
   a summing circuit for providing an up signal in response to an average of logic high values of said sample signal exceeding logic low values of said sample signal, and a down signal in response to an average of said low logic values of said sample signal exceeding said logic high values of said sample signal;
   a counter for counting up in response to activations of said up signal and counting down in response to activations of said down signal to provide a count signal; and
   a reference voltage generator for generating the reference voltage in response to said count signal.

2. The data recovery circuit of claim 1 wherein:
   said sampling circuit samples said comparator output signal in response to a bit clock signal to provide a data sample signal and a complement of said bit clock signal to provide an edge sample signal; and
   said summing circuit selects one of said data sample signal and said edge sample signal as said sample signal in response to a mode signal.

3. The data recovery circuit of claim 2 wherein said summing circuit comprises:
   a bit accumulator having a first input for receiving said data sample signal, a second input for receiving said edge sample signal, a control input for receiving said mode signal, a first output for providing an overflow signal, and a second output for providing an underflow signal; and
   a lowpass filter having inputs for receiving said overflow and underflow signals, and outputs for providing said up and down signals.

4. The data recovery circuit of claim 2 further comprising:
   a controller for selecting said data sample signal in a coarse tuning mode to provide an initial value of the reference voltage, and selecting said edge sample signal in a fine tuning mode to provide a tuned reference voltage.

5. The data recovery circuit of claim 4 further comprising:
   a plurality of additional data recovery circuits, wherein each of said plurality of additional data recovery circuits recovers a respective one of a plurality of data input signals using said tuned reference voltage.

6. The data recovery circuit of claim 4 wherein said controller further performs receive signal training to place said bit clock signal in a center of a data eye between said coarse tuning mode and said fine tuning mode.

7. The data recovery circuit of claim 4 further comprising:
   a bus; and
   a data generating circuit for providing said data input signal to said comparator over said bus.

8. The data recovery circuit of claim 7 wherein said data generating circuit comprises a double data rate five (DDR) synchronous dynamic random access memory (SDRAM).

9. The data recovery circuit of claim 7 wherein said controller enables said data generating circuit to provide a continuously alternating pattern of zeros and ones in said coarse tuning mode.

10. A data communication system having a receiver comprising:
    a plurality of data recovery circuits, each comparing a respective one of a plurality of data input signals to a reference voltage at a time determined by a corresponding bit clock signal to provide a corresponding received data output signal; and
    a shared reference voltage loop circuit having an input for receiving a received data output signal of one of said plurality of data recovery circuits, and an output for providing a signal representative of said reference voltage to each of said plurality of data recovery circuits, wherein in a training mode, said shared reference voltage loop circuit adjusts said signal to tune said reference voltage.

11. The data communication system of claim 10 wherein each of said plurality of data recovery circuits comprises:
    a data terminal for receiving said respective one of said plurality of data input signals;
    a comparator circuit having a first input coupled to said data terminal, a second input, a clock input for receiving said bit clock signal, and an output for providing said corresponding received data output signal; and
    a digital-to-analog converter (DAC) having an input, and an output coupled to said second input of said comparator.

12. The data communication system of claim 11 wherein:
    said comparator circuit of said one of said plurality of data recovery circuits provides a data sample signal in response to said bit clock signal and a difference between said first and second inputs, and provides an edge sample signal in response to a complement of said bit clock signal and said difference between said first and second inputs.

13. The data communication system of claim 12 wherein said shared reference voltage loop circuit comprises:
    a summing circuit for selecting one of said data sample signal and said edge sample signal as an input sample signal in response to a mode signal, and for providing an up signal in response to an average of logic high values of said input sample signal exceeding logic low values of said input samples signal, and a down signal in response to an average of said low logic values of said input sample signal exceeding said logic high values of said input sample signal; and
    a counter for counting up in response to activations of said up signal and counting down in response to activations of said down signal to provide said signal representative of said reference voltage.

14. The data communication system of claim 13 wherein:
    said shared reference voltage loop circuit selects said data sample signal in a coarse tuning mode to provide an initial value of the reference voltage, performs receive signal training to place said bit clock signal in a center of a data eye between said coarse tuning mode and a fine tuning mode, and selects said edge sample signal in said fine tuning mode to provide a subsequent value of the reference voltage.

15. The data communication system of claim 11 wherein said shared reference voltage loop circuit performs receive signal training to place said bit clock signal in a center of a data eye, and further has a clock output for providing said bit clock signal, so trained, to said clock input of said comparator circuit of each of said plurality of data recovery circuits.

16. The data communication system of claim 11 further comprising a plurality of clock and data recovery loop circuits corresponding to said plurality of data recovery circuits, each performing receive signal training on said respective one of said plurality of data input signals to place said bit clock signal in a center of a respective data eye, and having a clock output for providing said bit clock signal, so trained, to said clock input of said comparator circuit a respective one of said plurality of data recovery circuits.

17. The data communication system of claim 11 further comprising:
   a data generating circuit having a plurality of output buffers; and
   a bus for connecting said plurality of output buffers to corresponding ones of said plurality of data recovery circuits.

18. The data communication system of claim 17 wherein said data generating circuit comprises a double data rate (DDR) synchronous dynamic random access memory (SDRAM).

19. The data communication system of claim 17 wherein the data communication system enables said data generating circuit to provide a continuously alternating pattern of zeros and ones in a coarse tuning mode.

20. A method of generating a reference voltage for use in a clock and data recovery (CDR) circuit comprising:
   setting the reference voltage to a nominal voltage;
   setting a sampling clock to a nominal delay;
   coarse-tuning the reference voltage using the sampling clock and a first set of tuning data, the first set of tuning data having a data eye with a center;
   training the sampling clock to delay the sampling clock to the center of the data eye; and
   fine-tuning the reference voltage using a complement of the sampling clock and a second set of tuning data.

21. The method of claim 20, wherein the first set of tuning data includes a pattern of alternating ones and zeros.

22. The method of claim 21, wherein the second set of tuning data includes the pattern of alternating ones and zeros.

23. The method of claim 21, wherein the second set of tuning data includes a random pattern of ones and zeros.

* * * * *